United States Patent
Inaba

[19]

[11] Patent Number: 5,961,334
[45] Date of Patent: Oct. 5, 1999

[54] SUSPENSION CONNECTION STRUCTURE FOR A MAGNETIC HEAD

[75] Inventor: Masaichi Inaba, Ushiku, Japan

[73] Assignee: Nippon Mektron, Ltd., Tokyo-to, Japan

[21] Appl. No.: 08/968,529

[22] Filed: Nov. 12, 1997

[30] Foreign Application Priority Data

Nov. 12, 1996 [JP] Japan .................................. 8-300160

[51] Int. Cl.⁶ .................................................. H01R 9/09
[52] U.S. Cl. ........................... 439/67; 439/77; 439/492; 360/104
[58] Field of Search ............................... 439/493, 67, 77, 439/92; 29/879; 360/97.01, 98.01

[56] References Cited

U.S. PATENT DOCUMENTS

| | | | |
|---|---|---|---|
| 5,172,286 | 12/1992 | Jurgenson | 360/104 |
| 5,361,491 | 11/1994 | Oomachi et al. | 29/852 |
| 5,632,627 | 5/1997 | Aoki | 439/67 |
| 5,737,837 | 4/1998 | Inaba | 29/884 |

*Primary Examiner*—Paula Bradley
*Assistant Examiner*—Alexander Gilman
*Attorney, Agent, or Firm*—Foley & Lardner

[57] ABSTRACT

A connection structure of a suspension for a magnetic head suitable for assembly automation is provided. The connection structure of a suspension for a magnetic head comprises a suspension (1) for a magnetic head which includes a circuit wiring pattern (4) for connecting to the terminal side of a magnetic head and is clasped by and supported between an actuator arm (9) and a base plate (10), a relay board (7) for connecting the circuit wiring pattern to a read/write amplifier-board, and a connecting portion consisting of a pair of terminals (6) and (8) provided at portions of the suspension for a magnetic head and the relay board which are clasped by the actuator arm and the base plate, and wherein the connecting portion is formed by positioning the pair of terminals opposite one another and bringing them into mutual contact.

2 Claims, 9 Drawing Sheets

SUSPENSION CONNECTION STRUCTURE FOR A MAGNETIC HEAD

BACKGROUND OF THE INVENTION

1. Field of the Invention

The present invention relates to a connection structure of a magnetic head used in a magnetic disc recording/playback device, and more particularly to a connection structure for connecting a circuit-wired suspension for a magnetic head to a read/write amplifier-board.

2. Description of the Related Arts

As shown in FIG. 8, for instance, in this type of suspension for a magnetic head, a base plate 10 is secured to the end of suspension 1 and this base plate 10 is secured to an actuator arm 9 to support suspension 1. A flexure 21 provided to the tip of suspension 1 is connected to a slider 22 on which a magnetic head is formed. A lead 23 partially secured by a support fork 25 formed on a load beam 24 connects the magnetic head on slider 22 to an external circuit such as, for instance, a read/write amplifier-board.

Base plate 10 a method such as disclosed in U.S. Pat. No. 5,172,286 shown in FIG. 9, for instance, wherein first and second base plates 10 and 10' on each of which is formed a thin cylindrical boss, connect together so as to clasp suspension 1 and secure it to actuator arm 9.

However, when using a lead 23 which is not fully integrated with suspension 1 as above, the rigidity of the lead 23 affects the adhesion of suspension 1; as a consequence, the adhesion of slider 22 is damaged. Furthermore, wind pressure caused by the flow of air created by the revolutions of the recording medium also acts on lead 23, adversely affecting the floating position of slider 22.

Technology such as disclosed in Japanese Patent Laid-Open No. 219618/1992 has been proposed to solve these problems. The above publication discloses a configuration in which a lead comprising a wire leading out from a magnetic head element is integrated in a single-unit with a suspension mechanism. A non-integrated lead is used to connect the integrated lead to a read/write amplifier-board. This configuration improves the tracking ability of the suspension and of the magnetic head.

However, when the suspension is connected to the read/write amplifier-board by a lead as above, the connection operation cannot easily be automated. This is an impediment to cost reduction otherwise obtainable through automation.

SUMMARY OF THE INVENTION

The present invention has been conceived after consideration of the above points and aims to provide a connection structure of a suspension for a magnetic head suitable for assembly automation.

In order to achieve the above objectives, a first aspect of the suspension connection structure for a magnetic head of the present invention comprises: a suspension for a magnetic head consisting of a circuit wiring pattern for connecting to a terminal on a magnetic head, said suspension being clasped and supported between an actuator arm and a base plate; a relay board for connecting the circuit wiring pattern to a read/write amplifier-board; and a connecting portion consisting of a pair of terminals provided at portions of the suspension for a magnetic head and the relay board which are clasped between the actuator arm and the base plate, said connecting portion formed by positioning the pair of terminals opposite one another and bringing them into mutual contact.

A second aspect of the present invention comprises a connection structure of a suspension for a magnetic head according to the first aspect, wherein the pair of terminals at the connecting portion are connected by welding fusible metal.

A third aspect of the present invention comprises a connection structure of a suspension for a magnetic head according to the first aspect, wherein the connecting portion is formed by pressing the pair of terminals into mutual contact.

A fourth aspect of the present invention comprises a connection structure of a suspension for a magnetic head according to the third aspect, wherein at least one connecting portion of the suspension for a magnetic head and the relay board comprises a conductive thin film inserted therebetween.

A fifth aspect of the present invention comprises a connection structure of a suspension for a magnetic head according to the third aspect, wherein at least one connecting portion of the suspension for a magnetic head and the relay board comprises a conductive bump.

A sixth aspect of the present invention comprises a connection structure of a suspension for a magnetic head according to the fifth aspect, wherein the conductive bump comprises a modifiable element which is bumped toward the relay board, said modifiable member being provided on the suspension for a magnetic head.

A seventh aspect of the present invention comprises a connection structure of a suspension for a magnetic head according to the third aspect, wherein the connecting portion comprises a protruding structure for locally pressing contacting surfaces of the pair of terminals.

A eighth aspect of the present invention comprises a connection structure of a suspension for a magnetic head according to the seventh aspect, wherein the protruding structure is provided on the base plate.

A ninth aspect of the present invention comprises a connection structure of a suspension for a magnetic head according to the seventh aspect, wherein the protruding structure is provided on the actuator arm.

DESCRIPTION OF THE PREFERRED EMBODIMENTS

Figure 1:
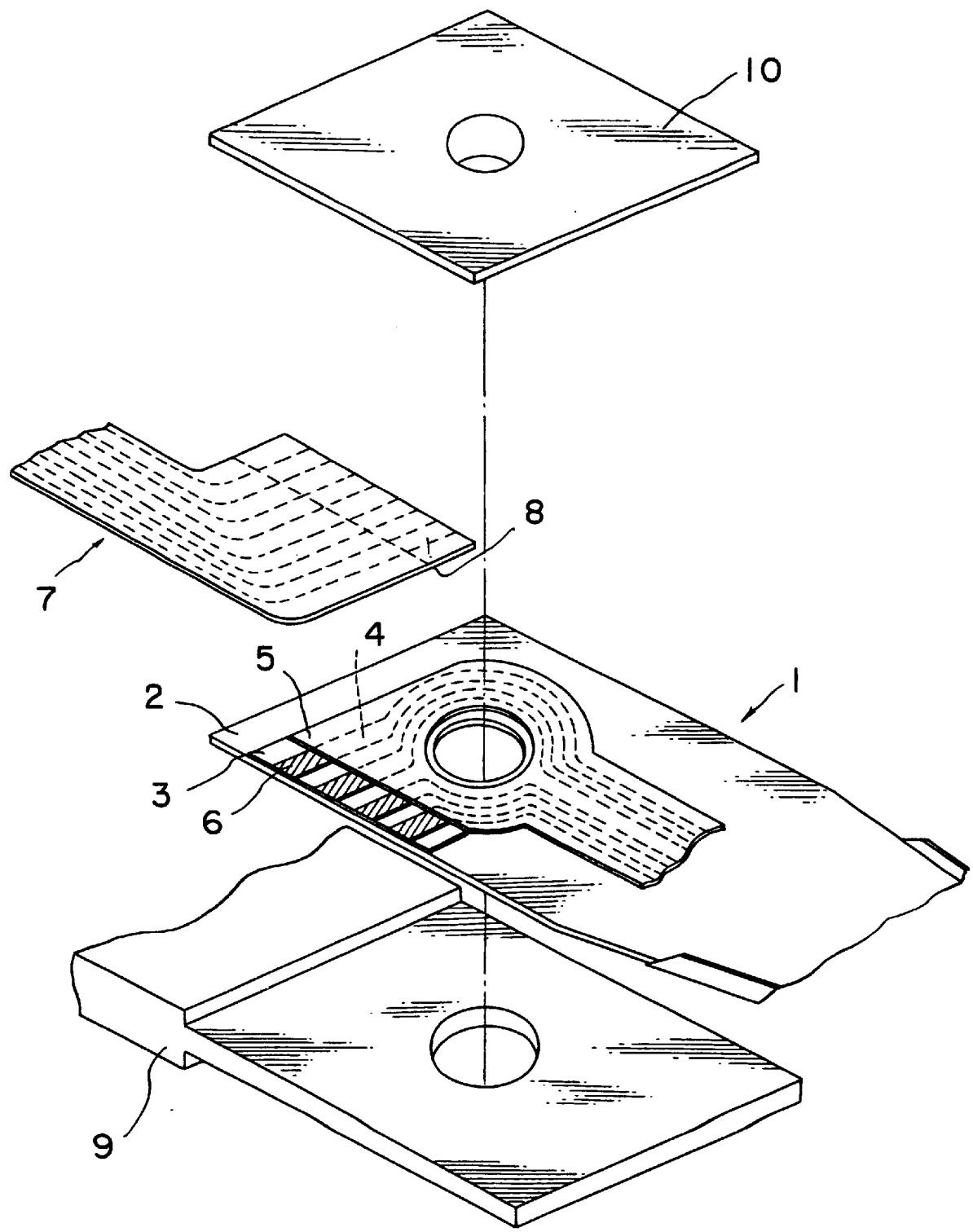
FIG. 1 is a diagonal view of the overall forms of the principle elements in an embodiment of the present invention.
Figure 2A:
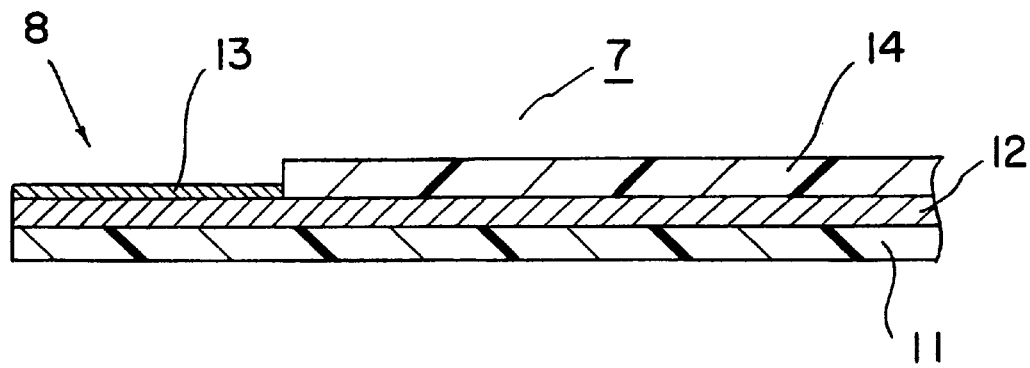
FIGS. 2A and 2B are side views of the constitution of a tip of relay board 7 connected to suspension 1.
Figure 2B:
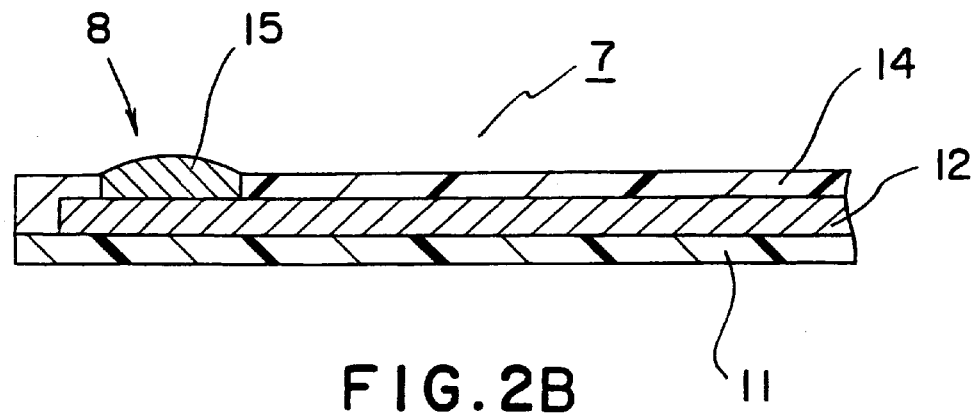
Figure 3:
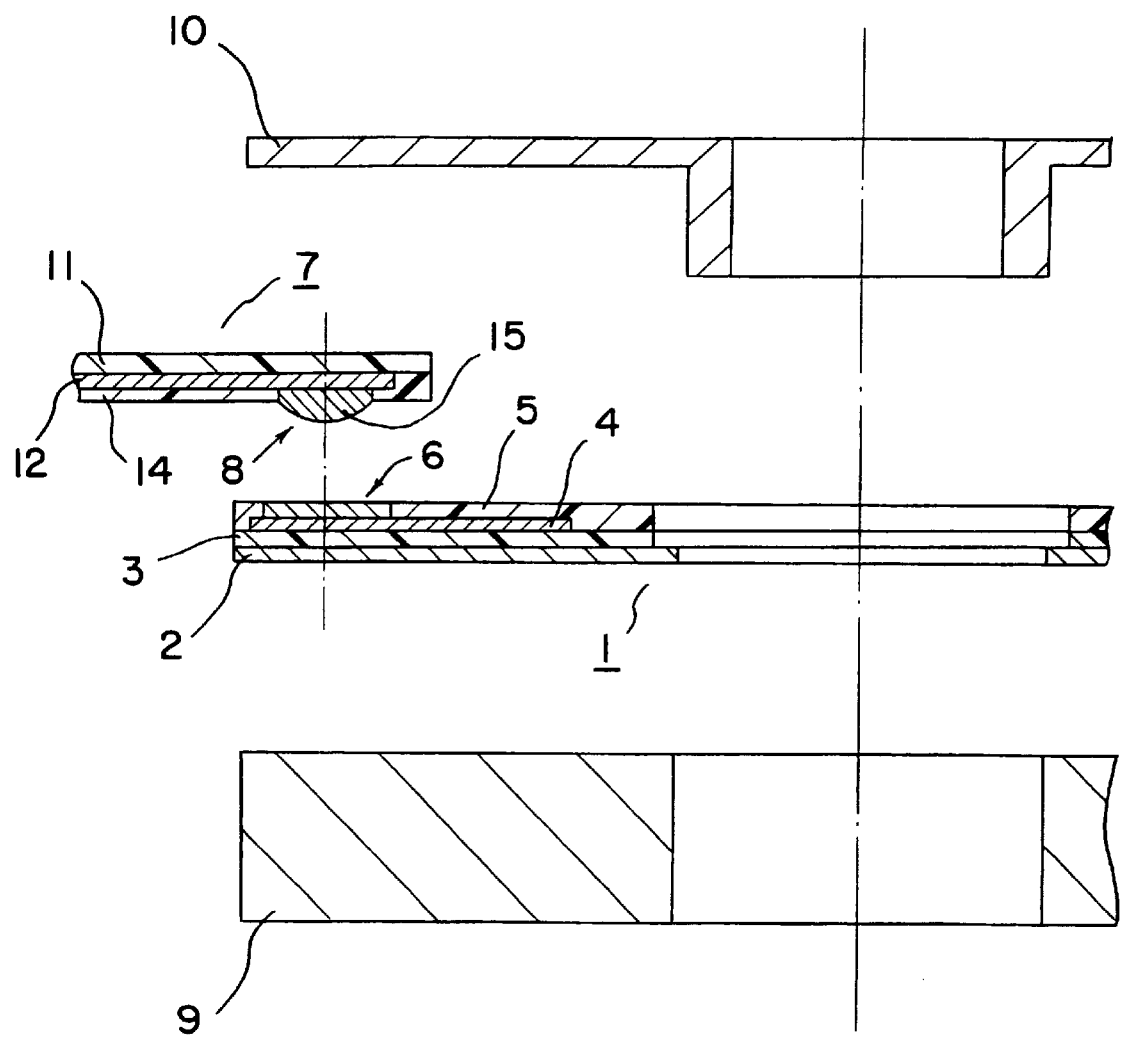
FIG. 3 is a cross-sectional side view of a first embodiment of a connecting portion of suspension 1 and relay board 7 according to the present invention, together with an actuator arm 9 and a base plate 10.
Figure 4:
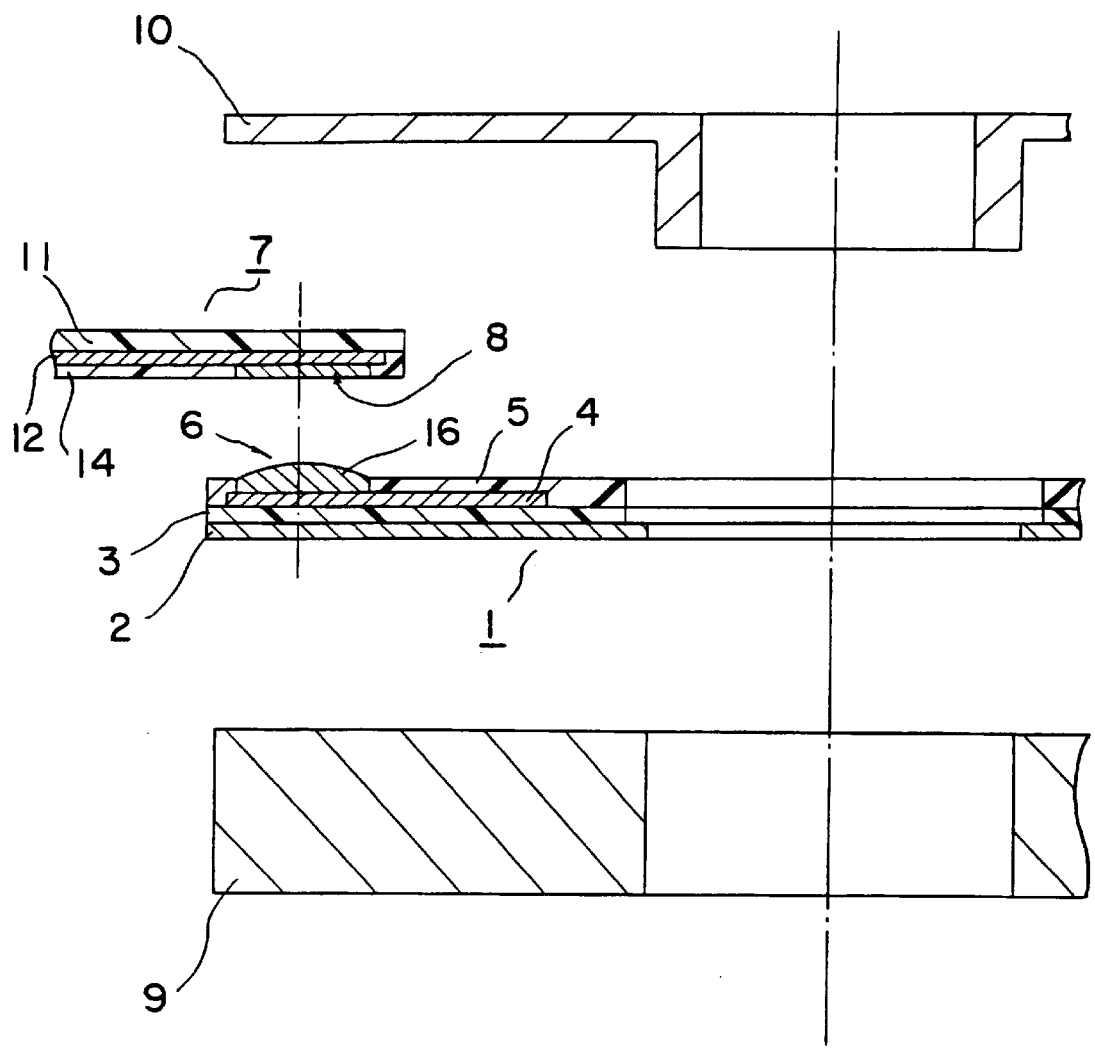
FIG. 4 is a cross-sectional side view of an embodiment in which the projection-depression relationship between terminal 6 and terminal 8 of FIG. 3 has been reversed.
Figure 5:
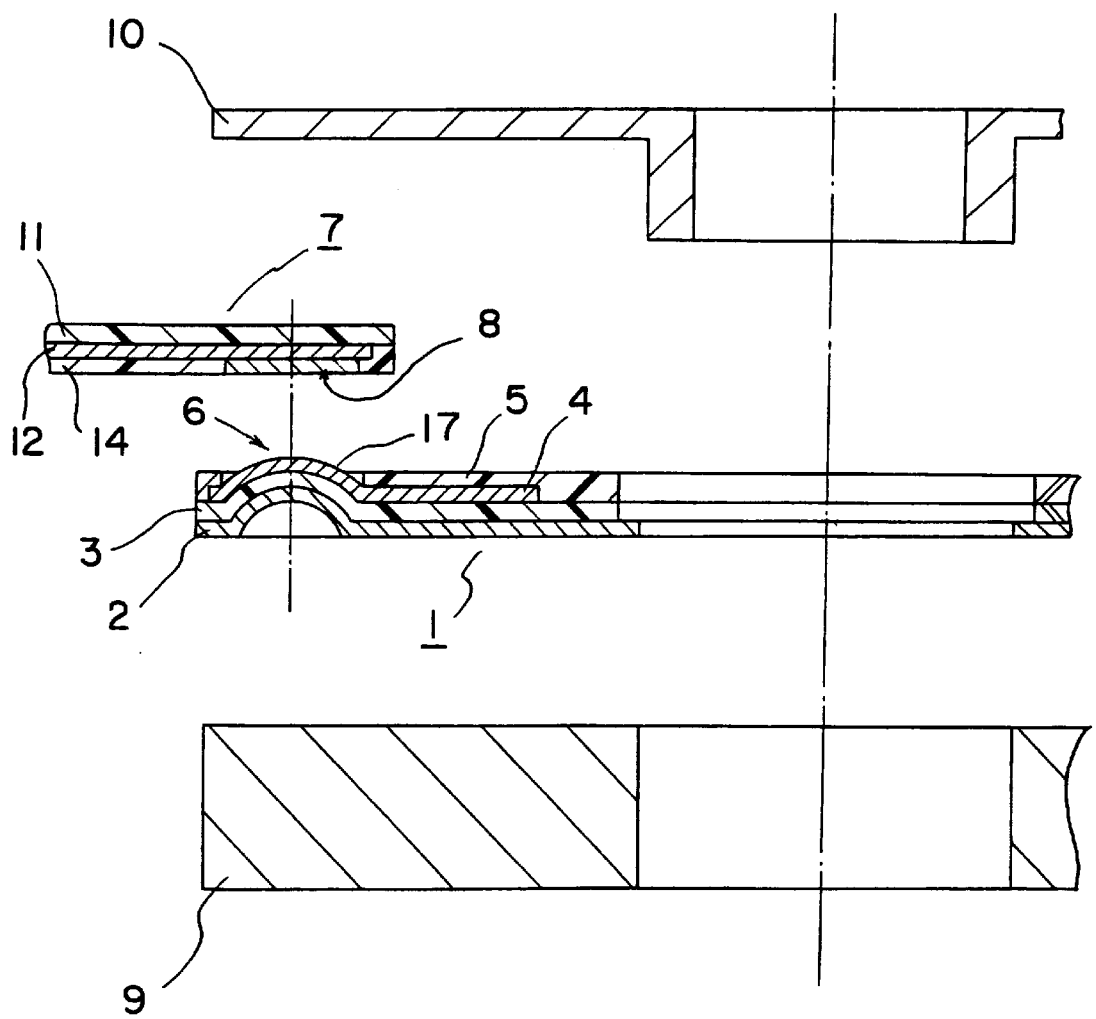
FIG. 5 is a cross-sectional side view of an embodiment in which the material forming bump 16 in FIG. 4 has been modified.
Figure 6:
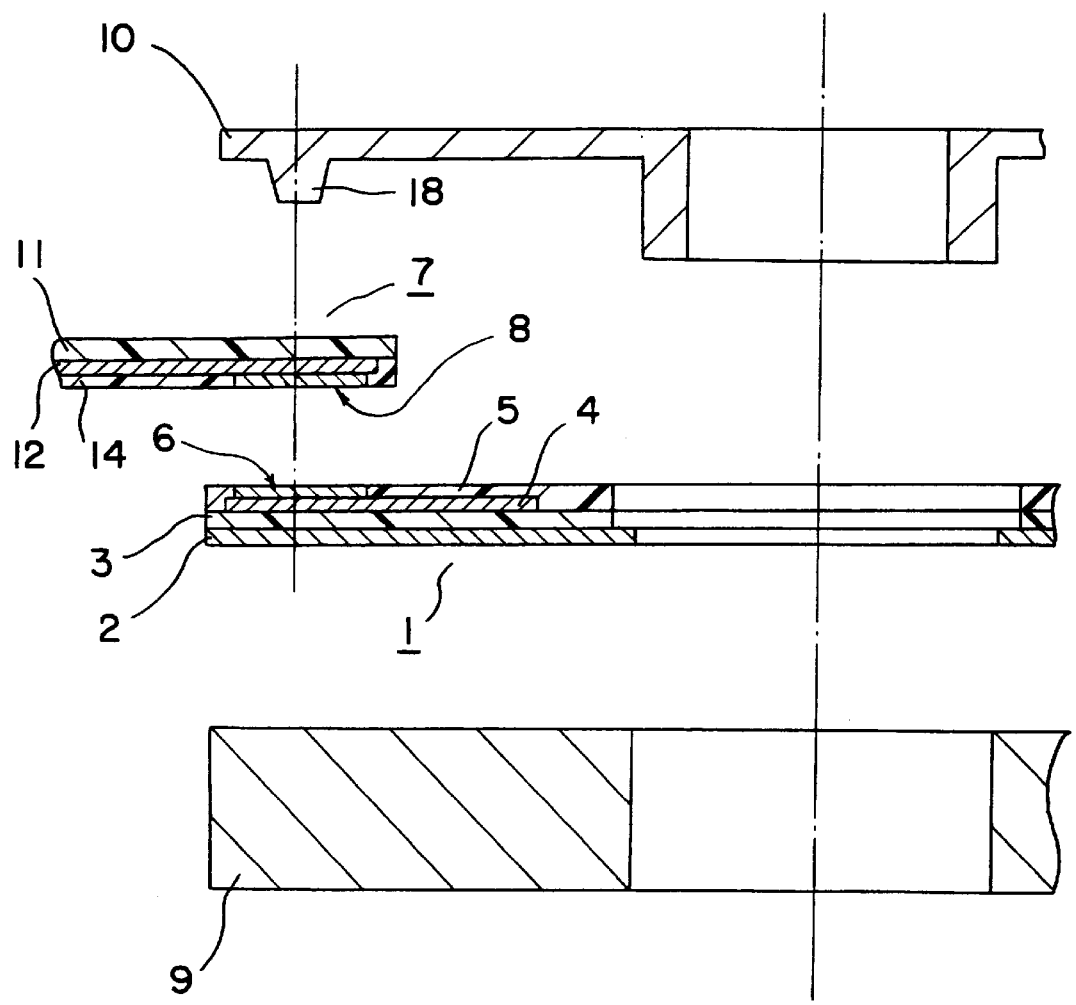
FIG. 6 is a cross-sectional side view of a second embodiment of a connecting portion of suspension 1 and relay board 7.
Figure 7:
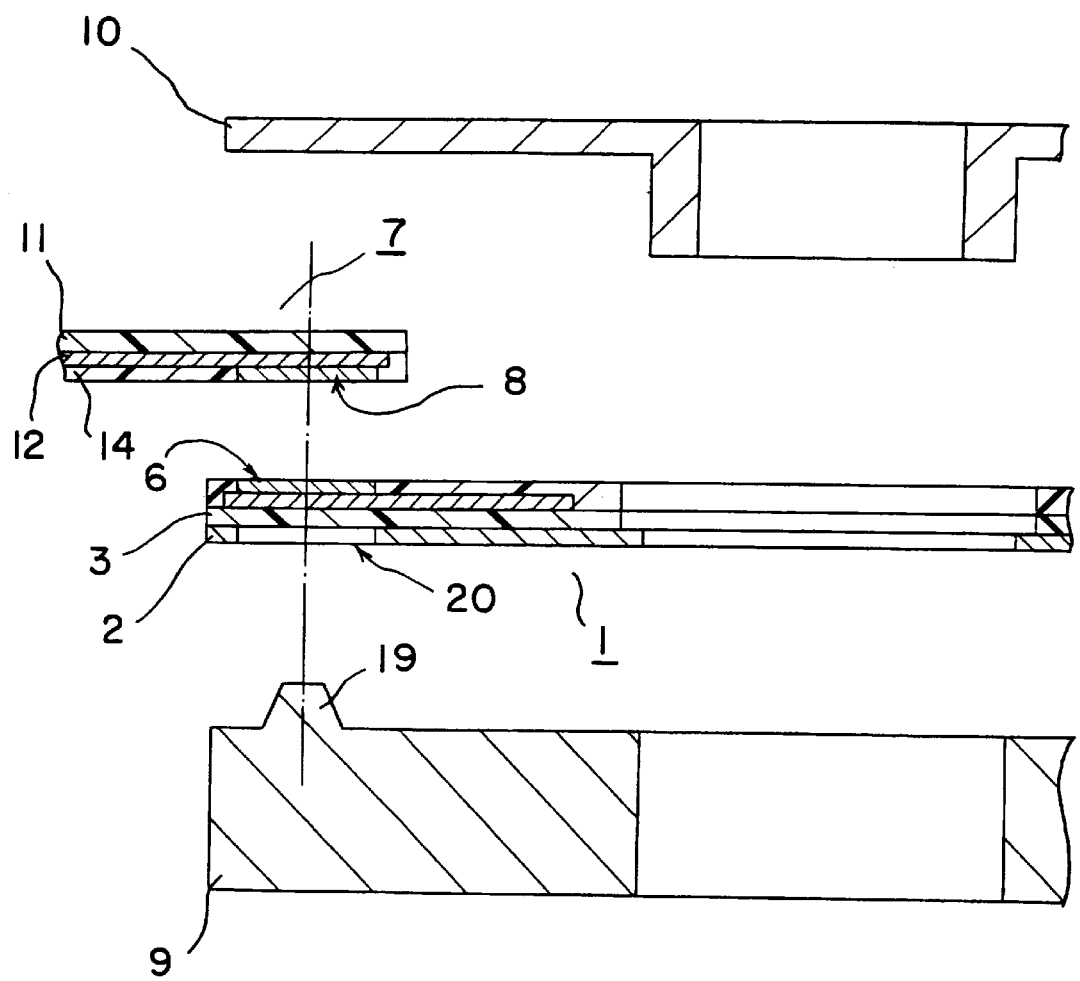
FIG. 7 is a cross-sectional side view of an embodiment in which protrusion 18 has been replaced by a protrusion provided on actuator arm 9.
Figure 8:
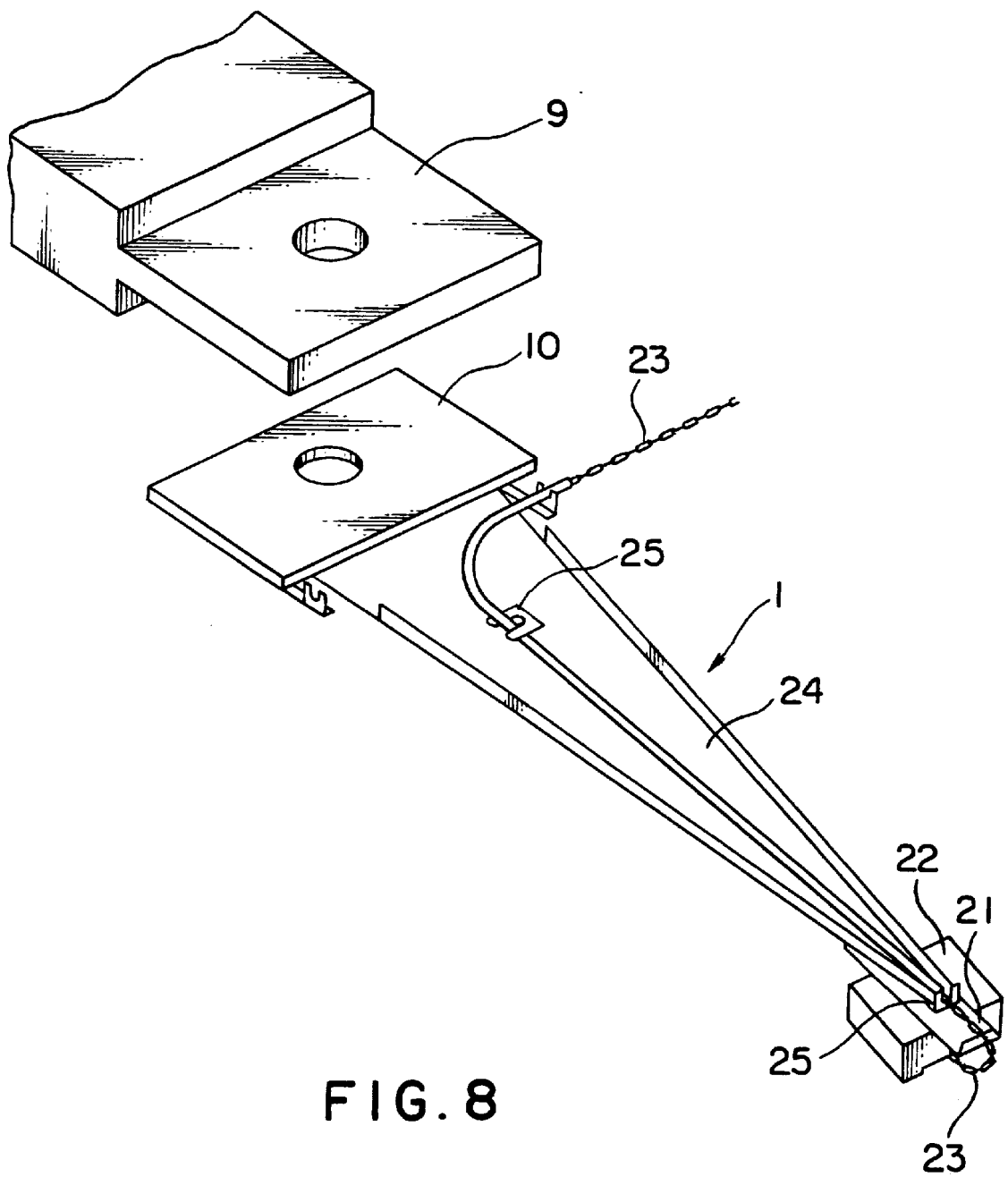
FIG. 8 is a diagonal view of the configuration of a conventional circuit-wired suspension for a magnetic head.
Figure 9:
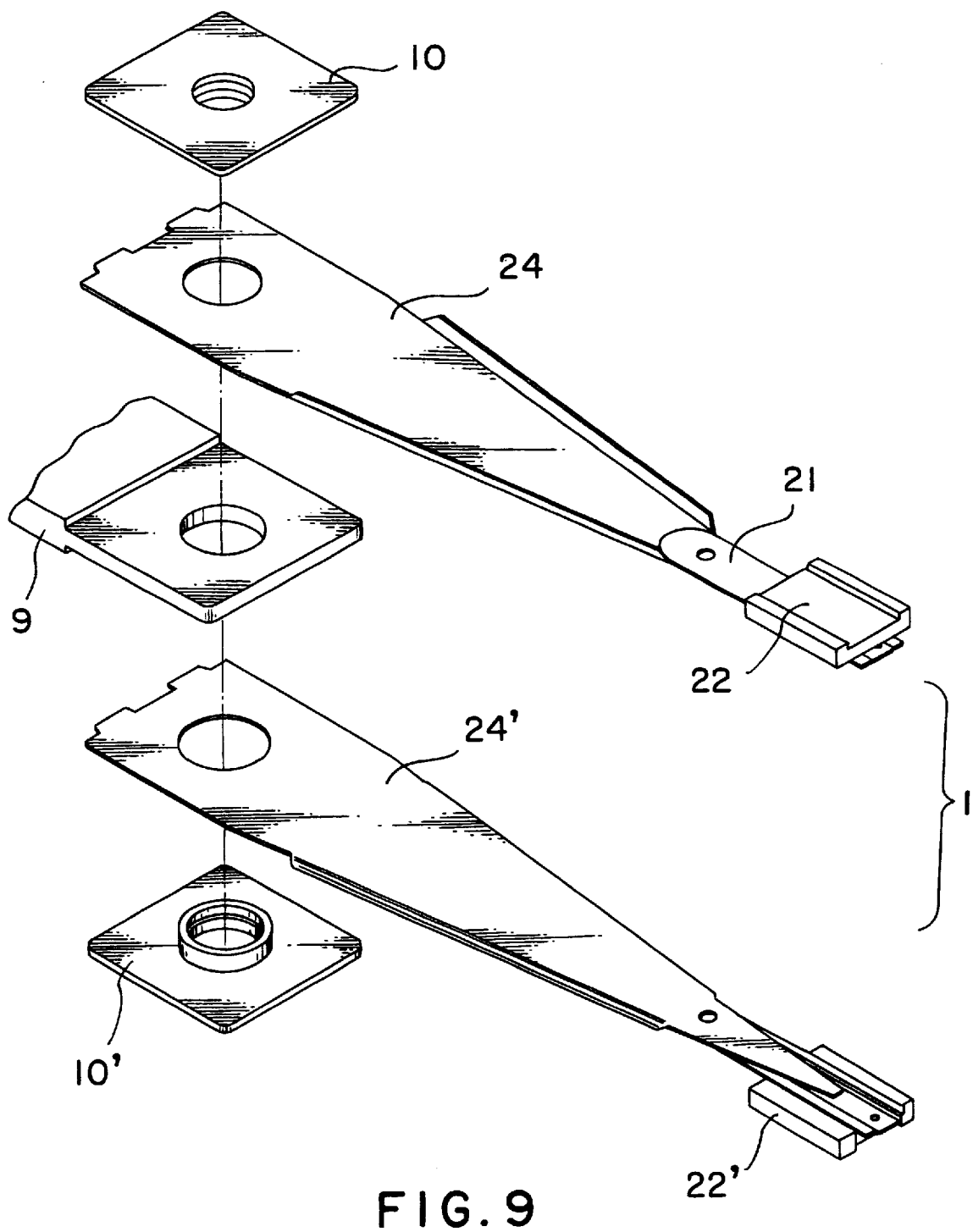
FIG. 9 is a diagonal view of another configuration of a conventional circuit-wired suspension for a magnetic head.

The preferred embodiments of the present invention will be explained hereunder with reference to FIGS. 1–7. FIG. 1 shows the overall constitution of the principle elements of an embodiment of the present invention; FIGS. 2A and 2B show two example configurations of relay boards; FIGS. 3–5 show a first example of a connecting portion of suspension 1 and relay board 7; FIGS. 6 and 7 show a second example of the same.

FIG. 1 is an exploded diagonal view of the principle elements of an embodiment of the present invention. FIG. 1 shows the end portion of suspension 1 comprising a spring-loaded metallic plate 2, on the upper surface of the end of which is provided a flexible insulating resin layer 3. A circuit wiring pattern 4 formed on flexible insulating resin layer 3 is covered by a surface protection layer 5. The surface protection layer 5 over the tip of circuit wiring pattern 4 is then removed and exposed to form terminal 6.

Terminal 8 on the lower surface of the tip of relay board 7 is connected to terminal 6. Relay board 7 consists of a sheet of flexible insulating base material 11 on one side of which a circuit wiring pattern is formed by removing copper foil provided on the side. With the exception of the tip portion on which terminal 8 is formed, the circuit wiring pattern is covered with a surface protection layer 5.

FIGS. 2A and 2B are side views of the constitution of the tip of relay board 7 connected to suspension 1. In the configuration shown in FIG. 2A, relay board 7 comprises a circuit wiring pattern 12 formed on flexible insulating base material 11, and a surface protection layer 14 formed on circuit wiring pattern 12. A surface processing metallic layer 13 which is thinner than surface protection layer 14 is formed above the end of the left side pattern 12 in the diagram to form terminal 8. In FIG. 2B, the configuration of relay board 7 is the same as that in FIG. 2A, but in this case terminal 8 consists of a metallic bump 15. This bump 15 is formed by plating using conductive metal such as, for instance, copper, nickel or gold.

FIG. 3 is a side view of the first embodiment of the connection between suspension 1 and relay board 7, also showing actuator arm 9 and base plate 10. In other words, relay board 7 is positioned above suspension 1 between actuator arm 9 and base plate 10 so that terminals 6 and 8 are opposite each other.

The relay board 7 used here is the board shown in FIG. 2B and terminal 8 is constructed as bump 15. Terminal 6 on suspension 1 consists of a hole which is shallower than terminal 8 on relay board 7, namely bump 15. Therefore, when terminal 6 and terminal 8 are placed close together, the lower tip (as shown in the diagram) of terminal 8 makes contact with the bottom of the hole which constitutes terminal 6. A connection is thus established between terminals 6 and 8. Provided that bump 15 is formed from an elastic material, terminals 6 and 8 can contact elastically. For instance, spherical and pillar-shaped resin elastic bodies with a conductive thin film formed on the surfaces thereof can be securely fitted between terminal 8 on relay board 7 and terminal 6 on suspension 1 in order to improve the reliability of the electrical connection.

When actuator arm 9 and base plate 10 are secured together, suspension 1 and relay board 7 are mechanically secured and, simultaneous to this, terminals 6 and 8 are electrically connected.

FIG. 4 shows an embodiment in which the projection-depression relationship between terminal 6 and terminal 8 has been reversed. In other words, in the embodiment shown in FIG. 4, terminal 6 comprises a bump 16 and terminal 8 comprises a shallow hole. Otherwise, this configuration is identical to that shown in FIG. 3, and the mechanical and electrical connections between suspension 1 and relay board 7 are similarly carried out.

FIG. 5 shows an embodiment in which the material forming bump 16 in FIG. 4 has been modified. In this case, bump 16 of terminal 6 in the embodiment shown in FIG. 4 has been replaced by bump 17 wherein metallic layer 2, flexible insulating resin layer 3 and circuit wiring pattern 4 are all formed so as to protrude upwards, metallic layer 2 being a spring means as well as a conducting means. In this case, bump 17 is naturally elastic.

FIG. 6 shows the connecting portion of suspension 1 and relay board 7 in a second embodiment. In this embodiment, both terminal 6 of suspension 1 and terminal 8 of relay board 7 comprise shallow holes. Terminal 8 is bumped toward terminal 6 by a forcing protrusion 18 on base plate 10 from behind relay board 7 to the center position of terminal 8, thereby connecting terminals 6 and 8.

FIG. 7 shows an embodiment in which protrusion 18 is replaced by a protrusion provided on actuator arm 9. In this case, terminal 6 is bumped toward terminal 8 by a forcing protrusion 19 from behind relay board 7 to a center position of terminal 6, thereby connecting terminals 6 and 8. A hole 20 is etched in metallic layer 2 in order to ensure that protrusion 19 is effective.

In the embodiments described above, the reliability of the connection between terminals 6 and 8 can be improved using a variety of materials. For instance, terminals 6 and 8 can be connected by fusing together layers of soldered plating provided on each of the terminal surfaces, or by applying a conductive coating, a conductive adhesive and an anisotropic conductive coating to both terminals, or by providing a conductive sheet and an anisotropic conductive bonding sheet between the terminals.

The configuration of the present invention as described above produces the following effects.

According to the first aspect of the present invention, an actuator arm and a base plate are disposed in mutual contact, terminals are provided to a suspension and to a relay board to be connected to this suspension, said suspension and relay board being held between actuator the arm and the base plate, and both terminals are connected by means of the contact between the actuator arm and the base plate. It is thus possible to carry out mechanical and electrical connecting in a single operation, thereby easily facilitating the automation of the connecting operation. As a result, the manufacturing costs of the suspension for a magnetic head and a magnetic recording/playback device using the suspension can be reduced.

According to the second aspect of the present invention, the terminals are connected with a joint formed by fusing fusible metal, thereby strengthening the joint between the terminals and increasing connection reliability.

According to the third aspect of the present invention, the pair of terminals are forcibly pressured together, thereby improving the firmness of the connection and increasing reliability.

According to the fourth aspect of the present invention, a conductive thin film is provided between at least one connecting portion of the suspension and the relay board, thereby increasing conductivity and reliability.

According to the fifth aspect of the present invention, at least one connecting portion of the suspension for a magnetic head and the relay board comprises a conductive bump, thereby improving the contact and increasing the reliability of the connection.

According to the sixth aspect of the present invention, the conductive bump consists of a modifiable element bumped toward the relay board and is provided on the suspension for a magnetic head, thereby improving the contact and increasing the reliability of the connection.

According to the seventh aspect of the present invention, the connecting portion comprises a protruding structure which locally presses the contacting sides of the two terminals together, thereby improving the contact and increasing the reliability of the connection.

According to the eighth aspect of the present invention, the protruding structure is provided on the base plate. The action of the base plate applies pressure to the contact, thereby improving the contact and increasing the reliability of the connection.

According to the ninth aspect of the present invention, the protruding structure is provided on the actuator arm. The action of the actuator arm applies pressure to the contact, thereby improving the contact and increasing the reliability of the connection.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A connection structure of a suspension for a magnetic head comprising: a suspension for a magnetic head consisting of a circuit wiring pattern for connecting to a terminal on a magnetic head, said suspension being clasped and supported between an actuator arm and a base plate;

a relay board for connecting the circuit wiring pattern to a read/write amplifier-board;

a connecting portion consisting of a pair of terminals provided at portions of the suspension for a magnetic head and the relay board which are clasped between the actuator arm and the base plate, said connecting portion formed by positioning the pair of terminals opposite one another and bringing them into mutual contact;

wherein the connecting portion is formed by pressing the pair of terminals into mutual contact;

wherein at least one connecting portion of the suspension for a magnetic head and the relay board comprises a conductive bump; and wherein the conductive bump comprises a modifiable element which is bumped toward the relay board, said modifiable element being provided on the suspension for a magnetic head.

2. A connection structure of a suspension for a magnetic head according to claim 1, wherein:

the modifiable element comprises curved portions of a metallic plate, a resin layer and the circuit wiring pattern; and the curved portion of the metallic plate acts as a spring to impart elasticity to the conductive bump.

* * * * *